United States Patent
Wang et al.

(10) Patent No.: US 7,829,896 B2
(45) Date of Patent: Nov. 9, 2010

(54) THIN FILM TRANSISTOR, MANUFACTURING METHOD THEREOF, AND TFT LCD USING THE SAME

(75) Inventors: Wei Wang, Beijing (CN); Hongjiang Wu, Beijing (CN); Chunping Long, Beijing (CN); Chang Hee Lee, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 212 days.

(21) Appl. No.: 11/935,073

(22) Filed: Nov. 5, 2007

(65) Prior Publication Data

US 2008/0105874 A1 May 8, 2008

(30) Foreign Application Priority Data

Nov. 3, 2006 (CN) .......................... 2006 1 0138044

(51) Int. Cl.
H01L 29/04 (2006.01)

(52) U.S. Cl. ...................... 257/72; 257/59; 257/E29.12

(58) Field of Classification Search ................... 257/59, 257/72
See application file for complete search history.

(56) References Cited

U.S. PATENT DOCUMENTS

| | | | |
|---|---|---|---|
| 5,407,846 A | | 4/1995 | Chan |
| 6,239,468 B1 * | | 5/2001 | Chang et al. ............... 257/347 |
| 6,906,385 B2 * | | 6/2005 | Moon et al. ................. 257/347 |
| 6,946,680 B2 * | | 9/2005 | Jang ............................ 257/59 |
| 7,053,408 B2 * | | 5/2006 | Kim ............................. 257/72 |
| 7,462,865 B2 * | | 12/2008 | Jung et al. .................... 257/59 |
| 2007/0246707 A1 | | 10/2007 | Deng |
| 2007/0272926 A1 | | 11/2007 | Deng |
| 2007/0298554 A1 | | 12/2007 | Long |
| 2008/0030639 A1 | | 2/2008 | Qiu |
| 2008/0100766 A1 | | 5/2008 | Ming |
| 2008/0105873 A1 | | 5/2008 | Wang |
| 2008/0111136 A1 | | 5/2008 | Qiu |
| 2008/0111934 A1 | | 5/2008 | Wu |
| 2008/0117347 A1 | | 5/2008 | Zhang |
| 2008/0123007 A1 | | 5/2008 | Cui |
| 2008/0123030 A1 | | 5/2008 | Song |
| 2008/0142802 A1 | | 6/2008 | Qiu |
| 2008/0142819 A1 | | 6/2008 | Liu |
| 2008/0164470 A1 | | 7/2008 | Wang |
| 2008/0166838 A1 | | 7/2008 | Long |

FOREIGN PATENT DOCUMENTS

JP 05110104 A2 4/1993

OTHER PUBLICATIONS

U.S. Appl. No. 12/104,575, filed Apr. 17, 2008, Xinxin Li.

* cited by examiner

*Primary Examiner*—Benjamin P Sandvik
(74) *Attorney, Agent, or Firm*—Hass & Nesbitt LLC; Daniel F. Nesbitt

(57) ABSTRACT

A thin film transistor (TFT) that comprises a gate electrode on a substrate, a gate insulation layer on the gate electrode, an active layer having a source region, a drain region, and a channel region on the gate insulation layer, and a source electrode and a drain electrode formed over the source region and drain region of the active layer respectively and facing each other with respect to the channel region. The profile of channel region between the source electrode and drain electrode is changed in a bend line. A method for forming the TFT is also provided.

13 Claims, 8 Drawing Sheets

THIN FILM TRANSISTOR, MANUFACTURING METHOD THEREOF, AND TFT LCD USING THE SAME

FIELD OF THE INVENTION

The present invention relates to a thin film transistor (TFT), the manufacturing method thereof, and a TFT liquid crystal display (TFT LCD) using the same.

BACKGROUND OF THE INVENTION

Liquid crystal display (LCD) techniques have being developed rapidly in the last decade with a great advance from the screen size to the display quality. The performances of LCDs have reached those of conventional cathode ray tubes (CRTs) in all respects with the continuous efforts, thus LCDs take a leading role as a substitute for CRTs.

As the production of LCDs increases, the intense competitions among manufacturers enable the enhancement of the product performances, with a focus on improving of the image quality of LCDs. Flickering and Mura (a phenomenon of poor image quality) are two main defects among those that affect the image displaying quality of LCDs. As well known, a TFT LCD displays a complete and accurate image by controlling a voltage applied on each of the sub-pixels arranged in a matrix so as to adjust the brightness of each sub-pixel. Each sub-pixel uses a TFT as a switching element. When an ON voltage (Von) is applied to the gate electrode of a TFT in a certain row, the TFT is turned on, and a signal from data lines is applied to a pixel electrode of the sub-pixel. When an OFF voltage (Voff) is applied to the gate electrode of the TFT, the TFT is turned off. The voltage difference between the pixel electrode and a common electrode that are facing each other determines the orientation of the liquid crystal molecules within the sub-pixel region, and thereby determines the luminance and display quality of the sub-pixel. However, since the gate electrode and the source electrode are overlapped in the TFT, a parasitic capacitance Cgs is produced, which is represented by $Cgs=\epsilon_0\epsilon_n A/d$, where $\epsilon_0$ represents the vacuum dielectric constant, $\epsilon_n$ represents the dielectric constant of a semiconductor material (e.g., n+ amorphous silicon (n+ a-Si)), A represents the overlapping area between the gate electrode and the source electrode, and d represents the vertical distance between the two metal layers of the gate electrode and the source electrode. As shown in FIG. 1, when the image display of the n-th frame begins, the level of gate signal on the x-th row jumps from Voff to Von, the TFT is turned on, data signal is applied, and the charging of the sub-pixel begins. The voltage Vp applied on the sub-pixel starts increasing and quickly approaches the level of data signal Vd. After the charging of the sub-pixel is completed, the gate signal level on the x-th row jumps back to Voff. The same operation repeats for the (x+1)-th row. When the gate voltage applied on the x-th row is changed back to Voff from Von, a voltage difference ΔVp is produced on the sub-pixel due to the overlapping of the gate electrode and the source electrode. That is, when the gate voltage is changed back to Voff from Von and thereby the TFT is turned off, Cgs may result in the voltage difference ΔVp on the sub-pixel. If Cgs is reduced, ΔVp can also be effectively decreased (from ΔVp to ΔVp', and ΔVp>ΔVp'), according to the equation of $\Delta Vp=[Cgs/(C_{LC}+Cgs+Cst)]\Delta Vg$, where $C_{LC}$ represents the capacitance of the LC layer, Cst represents a storage capacitance, ΔVp represents a voltage change produced on the sub-pixel when the gate voltage is changed from Von to Voff, and ΔVg is the difference between the Von and Voff.

FIGS. 2a, 2b and 2c are top plan views of three kinds of sub-pixels of the TFT LCDs in the related art. FIG. 2a shows a sub-pixel structure in which a storage capacitor Cst is formed by a gate line 1. The sub-pixel includes the gate line 1 (gate metal layer), an active layer 3, a data line (source/drain electrode metal layer) 4, a pixel electrode 6, a drain electrode 7, and a source electrode 8, wherein the storage capacitor Cst is formed in an overlapping area 10 between the pixel electrode 6 and the gate line 1. The gate line 1 and the data line 4 cross with each other and define a pixel area. The pixel electrode 6 is connected with the source electrode 8 via a via hole 15 (also see FIG. 3b). The sub-pixel structure of FIG. 2b is similar to that of FIG. 2a, except addition of two light blocking bars 11 in the gate metal layer The sub-pixel structure of FIG. 2c includes light blocking bars the same as those in FIG. 2b, and the storage capacitor Cst is formed by a storage common electrode comprising the storage common electrode 12 in the gate metal layer. The storage capacitor Cst is formed in an overlapping area 13 between the pixel electrode 6 and the storage common electrode 12 in the gate metal layer. FIG. 3a shows a schematic view of each sub-pixel comprising the gate metal layer 1, a gate insulation layer 2, the active layer 3, the source/drain electrode layer 4, a passivation layer 5, and the pixel electrode 6 stacked sequentially from bottom to top. The above three kinds of sub-pixels have the same TFT structure. FIG. 3b shows a cross-sectional view of the sub-pixel shown in FIG. 2a taken along the line 3b-3b of FIG. 2a, and the stacked layers are also shown in FIG. 3b.

A channel structure of the TFT in the related art is shown in the enlarged view of FIG. 4a. The profile of the channel between the source electrode and drain electrode in the active layer 3 is a straight line, and the channel region formed between the source electrode 8 and drain electrode 7 has no undulation as a whole (i.e., the edges of channel in the width direction have no undulation when the channel length is constant). FIG. 4b shows a cross-sectional view taken along the line 4b-4b of FIG. 4a. A parasitic capacitor Cgs is produced in an overlapping area 9 between the gate electrode 1 and the source electrode 8, which is inevitable in TFT device design. The Cgs may affect the value of the voltage change ΔVp on a sub-pixel, causing the flickering. Furthermore, in the manufacture process, the actual values of a width/length ratio (W/L) of the channel in TFTs vary between different display areas due to the factors such as instability of process and apparatus, resulting in different degrees of charging for sub-pixels in different areas. For example, when it is desired to display a certain gray level in the whole display screen, mura occurs in which some areas have an excessive luminance (whitening) while other areas have an inadequate luminance (darkening), due to different ΔVp of sub-pixels in different areas caused by different degrees of charging for sub-pixels in different areas.

SUMMARY OF THE INVENTION

Therefore, considering the above problems of the related art, the present invention is contemplated to decrease Cgs and/or increase the W/L of the channel of a TFT so as to suppress the flickering and mura phenomena, thereby improving the display quality.

According to an aspect of the invention, there is provided a thin film transistor (TFT). The TFT comprises a gate electrode over a substrate, a gate insulation layer over the gate electrode, an active layer having a source region, a drain region and a channel region over the gate insulation layer, and a source electrode and a drain electrode located over the source region and drain region of the active layer respectively and opposing each other with respect to the channel region. The profile of the channel region between the source electrode and drain electrode is changed in a bend line.

In one embodiment, the profile along the edge of the source and drain electrodes is changed in a bend line, wherein the number of the undulations in the bend line is N, where N ≥1. The bend line includes sub-bends, and the number of the sub-bends is M, where M≥1. The direction change of each sub-bend is in a range from 0 degree to 180 degree. The gate electrode and the data line are formed of a material selected from the group consisting of Mo, Al, AlNi alloy, MoW alloy, Cr, Cu, and any combination thereof, in a structure selected from the group consisting of a single layer structure and a multiple layer structure. The gate insulation layer is formed of a material selected from the group consisting of silicon nitride, silicon oxide, and silicon oxynitride.

When the above TFT is applied to a sub-pixel structure of a TFT LCD, preferably the sub-pixel structure may further includes a storage capacitor formed with the gate line and/or light blocking bars formed on both sides of the pixel electrode.

According to another aspect of the invention, there is provided a method of forming a thin film transistor (TFT). The method comprises the steps of forming a gate electrode over a substrate, forming a gate insulation layer over the gate electrode, forming an active layer having a source region, a drain region, and a channel region over the gate insulation layer, and forming a source electrode and a drain electrode over the source region and drain region of the active layer respectively. The source electrode and a drain electrode oppose each other with respect to the channel region. The profile of the channel region between the source electrode and drain electrodes is changed in a bend line.

In one embodiment of the invention, after the metal layer is formed, the source electrode and the drain electrode are patterned by an exposure and etching process with a mask. The profile of the mask corresponding to the channel region is changed in the bend line, so that the profile of the channel region between the source and drain electrodes is changed in the bend line.

In one embodiment of the invention, the number of the undulations in the bend line of the channel region is N, N≥1. The bend line includes sub-bends and the number of the sub-bends is M, M≥1. The direction change of each sub-bend is in a range from 0 degree to 180 degree.

According to yet another aspect of the invention, there is provided a TFT LCD. The TFT LCD comprises a substrate, a gate line and a data line formed on the substrate and crossing each other to define a sub-pixel region, a pixel electrode formed in the sub-pixel region, and a TFT according to the present invention formed at where the gate line and the data line crosses. The gate electrode of the TFT is connected with the gate line, the one of the source and drain electrodes is connected with the date line, and another one of the source and drain electrodes is connected with the pixel electrode.

Compared with the related art, since the profile of the overlapping area between the source electrode and the gate electrode is changed in a bend line (that may comprise M sub-bends, M≥1), and the profile of the channel region between the source and drain electrodes has N undulations, N ≥1 (i.e., in the case of constant channel length, the width edge of the channel region may change along the bend line), the overlapping area between the gate electrode and the source electrode will be effectively decreased when the W/L of the channel region is kept unchanged. As a result, the voltage difference between the pixel electrode and the common electrode keeps relatively constant, thus reducing the flickering.

Furthermore, since the width/length ratio (W/L) is increased when the overlapping area between the gate and source electrode keeps constant, the channel width is increased by a bend profile of the overlapping area between the gate electrode and the source electrode. Therefore in the manufacturing process, the process margin for the charging current is enhanced, the charging rate of the sub-pixel is ensured, and the voltage difference for sub-pixels in different display areas caused by factors such as the instability of the process and apparatus is effectively reduced so as to improve the display quality.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein:

FIG. 3b is a cross-sectional view taken along line 3b-3b of FIG. 2a.

FIG. 4b is a cross-sectional view taken along line 4b-4b of FIG. 4a.

FIG. 5b is a cross-sectional view taken along 5b-5b of FIG. 5a.

DESCRIPTION OF THE PREFERRED EMBODIMENTS

Figure 5A:
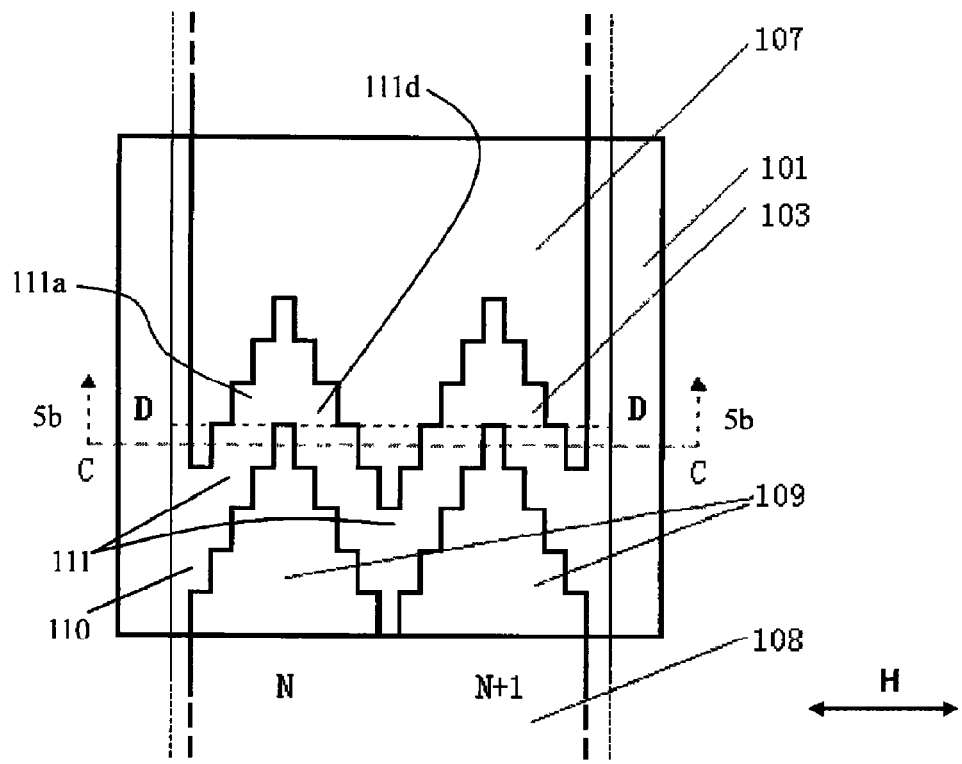
FIG. 5a is a plan view of the channel region for a TFT according to an embodiment of the present invention.

FIG. 5a is a plan view of the channel region of a TFT according to an embodiment of the present invention.

As shown in FIG. 5a, an active layer 103 having a source region, a drain region and a channel region therebetween is formed on a gate electrode 101. A drain electrode 107 and a source electrode 108 are formed over the active layer 103 in the source and drain region on the opposite sides of the channel region, respectively. The edge of an overlapping area 109 between the source electrode 108 and the gate electrode 101 (i.e., the edge of the source electrode opposite to the drain electrode) is changed in a bend line as a whole so as to assume a curved or angular shape. That is, the general profile of the channel region is changed in a non-linear manner and has undulation(s), and the bend line for example can assume various shapes such as zigzag, wave, and the like. The zigzag or wave can have one or more peaks (undulations), and if there are a plurality of peaks, the peaks can be uniform or not. The number of undulation in the bend line is N, where N≥1. Each undulation of the bend line may further comprise sub-bends in a curved or angular shape, and the sub-bends are also changed in a non-linear manner and can assume various shapes such as zigzag, wave, and the like, and the zigzag or wave can have one or more peaks that are uniform or not. The number of the sub-bends of the bend line is M, where M≥1. For example, in the embodiment as shown in FIG. 5a, the bend line 111 of the edge of the channel region is formed in a zigzag shape as a whole, and sub-bend 110 on each side of the zigzag shape is formed as a right angle shape, where N=2, M=36. The edge of an overlapping area between the drain electrode 107 and the gate electrode 101 (i.e., the edge of the channel region with respect to the overlapping area 109) is formed in a bend line that corresponds to that of the overlapping area 109, so that the width of the channel region maintains substantially constant in the horizontal direction (H) in FIG. 5a. Alternatively, the bend line also can have no sub-bends, that is, the bend line is formed of straight lines or a smooth curve line only.

Figure 4A:
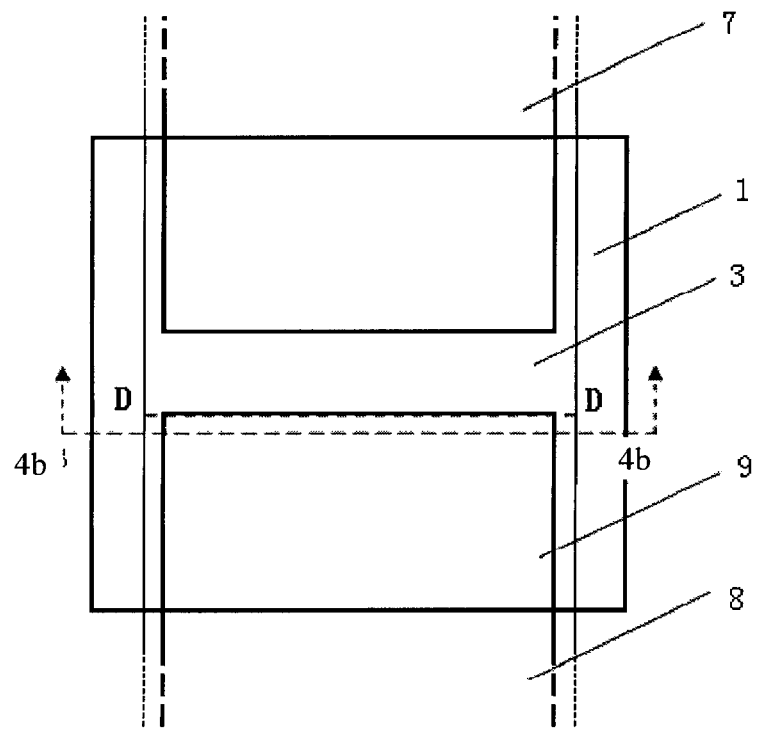
FIG. 4a is a plan view of the channel region for a TFT in a single sub-pixel according to the related art.
Figure 4B:
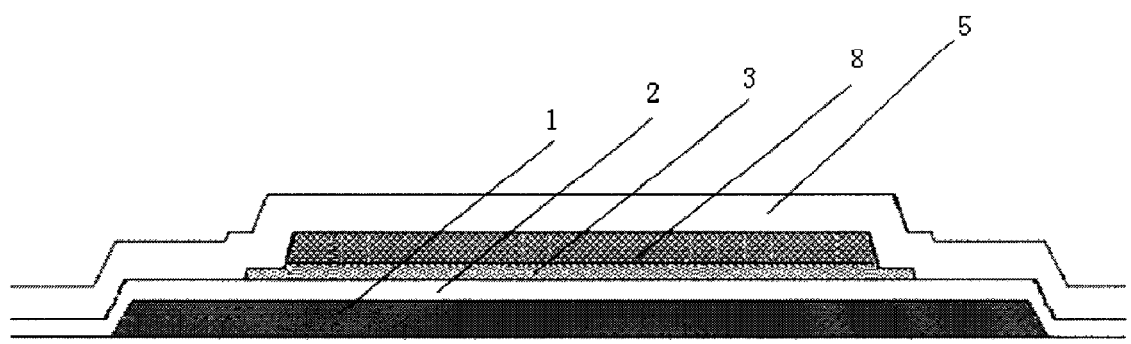
Figure 5B:
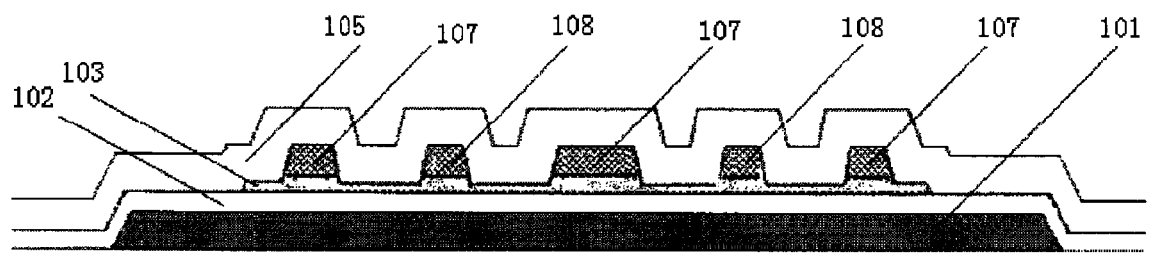

FIG. 5b is a cross-sectional view taken along the line 5b-5b in FIG. 5a. Comparing the structure of FIG. 5b in accordance with the invention with that in the related art as shown in FIG. 4b, the source electrode and the drain electrode alternatively appear in FIG. 5b so that the W/L of the channel region is effectively increased in the present invention. In addition, as shown in FIG. 5a and FIG. 4a, when the W/L of the channel region is kept unchanged, the overlapping area 109 between the source electrode 108 and the gate electrode 101 is substantially decreased (as indicated by line D-D in FIGS. 5a and 4a, wherein the line D-D corresponds to the edge of the channel region on the source electrode side in the prior art).

As indicated by equation $Cgs=\epsilon_0\epsilon_n S/D$ and $\Delta Vp=[Cgs/(C_{LC}+Cgs+Cst)]\Delta Vg$, the parasitic capacitance Cgs is changed in proportion to the overlapping area S between the gate electrode and source electrode, while the change of $\Delta Vp$ has the same tendency as that of Cgs. Thus, the changes of the overlapping area S between the gate electrode and source electrode will directly affect the value of $\Delta Vp$. Compared with conventional structure in the prior art, in the present embodiment, the overlapping area S between the gate electrode 101 and the source electrode 108 is decreased when the W/L of the channel region is kept unchanged, and the value of S depends on the sizes of the gate electrode and the source electrode. $\Delta Vp$ is also reduced, and as a result, the voltage difference between the sub-pixel and the common electrode keeps relatively unchanged, thus the flickering phenomenon is reduced.

Figure 5C:
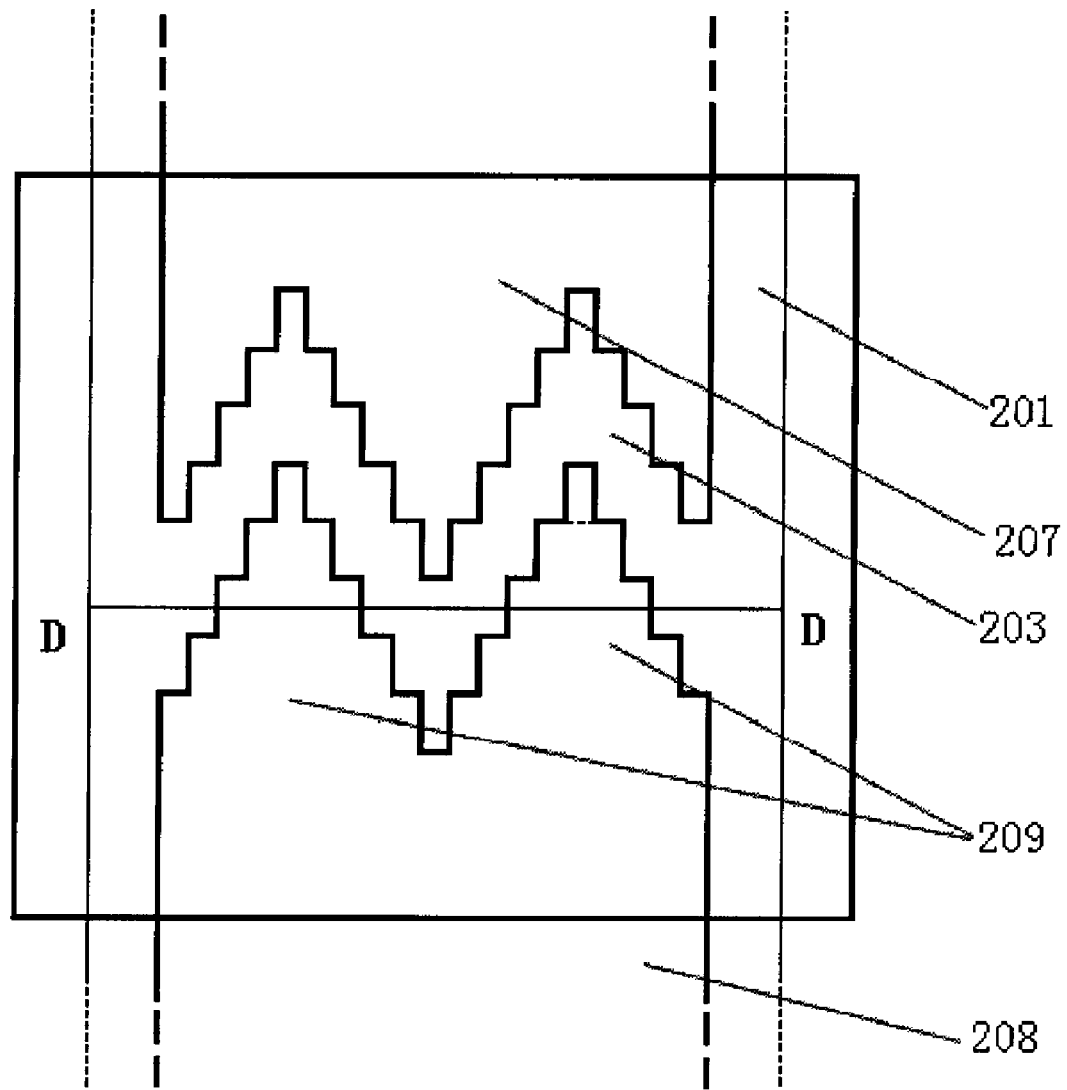
FIG. 5c is a plan view of the channel region for a TFT according to another embodiment of the present invention.

FIG. 5c is a plan view of the channel region for a TFT according to another embodiment of the present invention.

As is shown in FIG. 5c, an active layer 203 is formed on a gate metal layer 201. A drain electrode 207 and a source electrode 208 are formed over the active layer 203 on the opposite sides of the channel region of the active layer. The profile of an overlapping area 209 between the source electrode 208 and the gate electrode 201 is changed in a bend line as a whole so as to assume a curved or angular shape, and the number of undulation of the bend line is N, N≥1. The bend line further comprises sub-bends in a curved or angular shape. The number of the sub-bends is M, where M≥1. For example, as shown in FIG. 5c, N=2, M=36. As shown in FIG. 5c, if the source electrode is divided along line D-D (as indicated by line D-D in FIGS. 5c and 4a, wherein the line D-D corresponds to the edge of the channel region on the source electrode side in the related art), the source electrode on the left side of the line D-D can exactly match the gap area on the right side, i.e., the overlapping area 209 between the source electrode 208 and gate electrode 201 shown in FIG. 5c is the same as that shown in FIG. 4a. In the case that the overlapping area is unchanged, the edge of the channel is rendered long along the bend line so that the width to length ratio (W/L) of the channel region is effectively increased.

As indicated by equation $Ion=\mu n\, Ci(W/L)\,[(Vg-Vth)Vd-(Vd^2/2)]$, where μn represents a carrier mobility, Ci represents a parasitic capacitance Cgs per unit area (i.e., Cgs/S) between the gate electrode and the source electrode, W represents the channel width of the TFT, L represents the channel length of the TFT, Vg represents gate voltage, Vth represents a threshold voltage of a TFT, and Vd represents a drain voltage. The charging current Ion is in proportion to the width length ratio (W/L) of the channel. Thus, the change of the W/L of the channel will affect the charging current Ion proportionally, and in turn a process margin for the Ion may be enhanced by increasing W/L. As such, the channel width is increased by the bend profile of the overlapping area between the gate electrode and the source electrode. Therefore in the manufacturing process, the process margin for the charging current is enhanced and a charging rate is ensured, and the voltage difference for sub-pixels among different display areas caused by the factors such as the instability of process and apparatus may be effectively reduced so as to improve the display quality.

Figure 1:
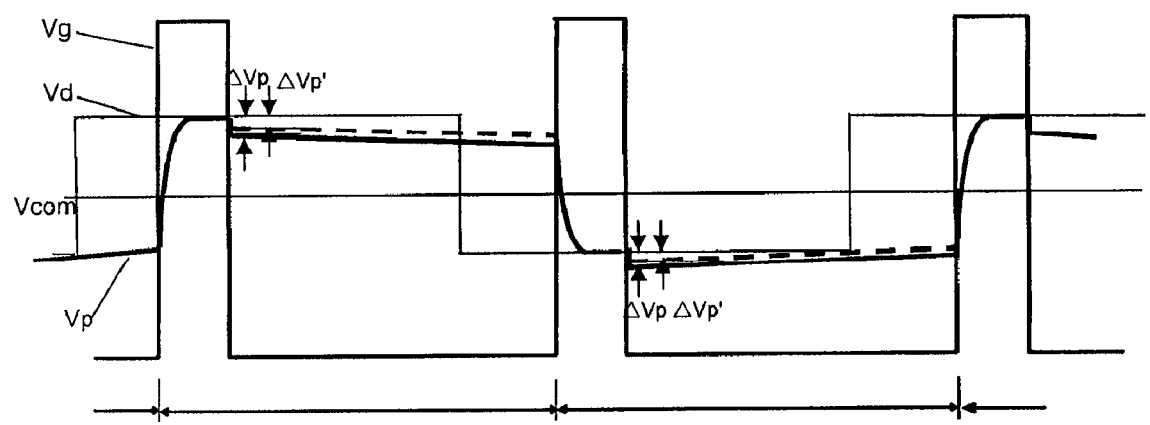
FIG. 1 shows a signal voltage change curve of a sub-pixel according to the related art.
Figure 2A:
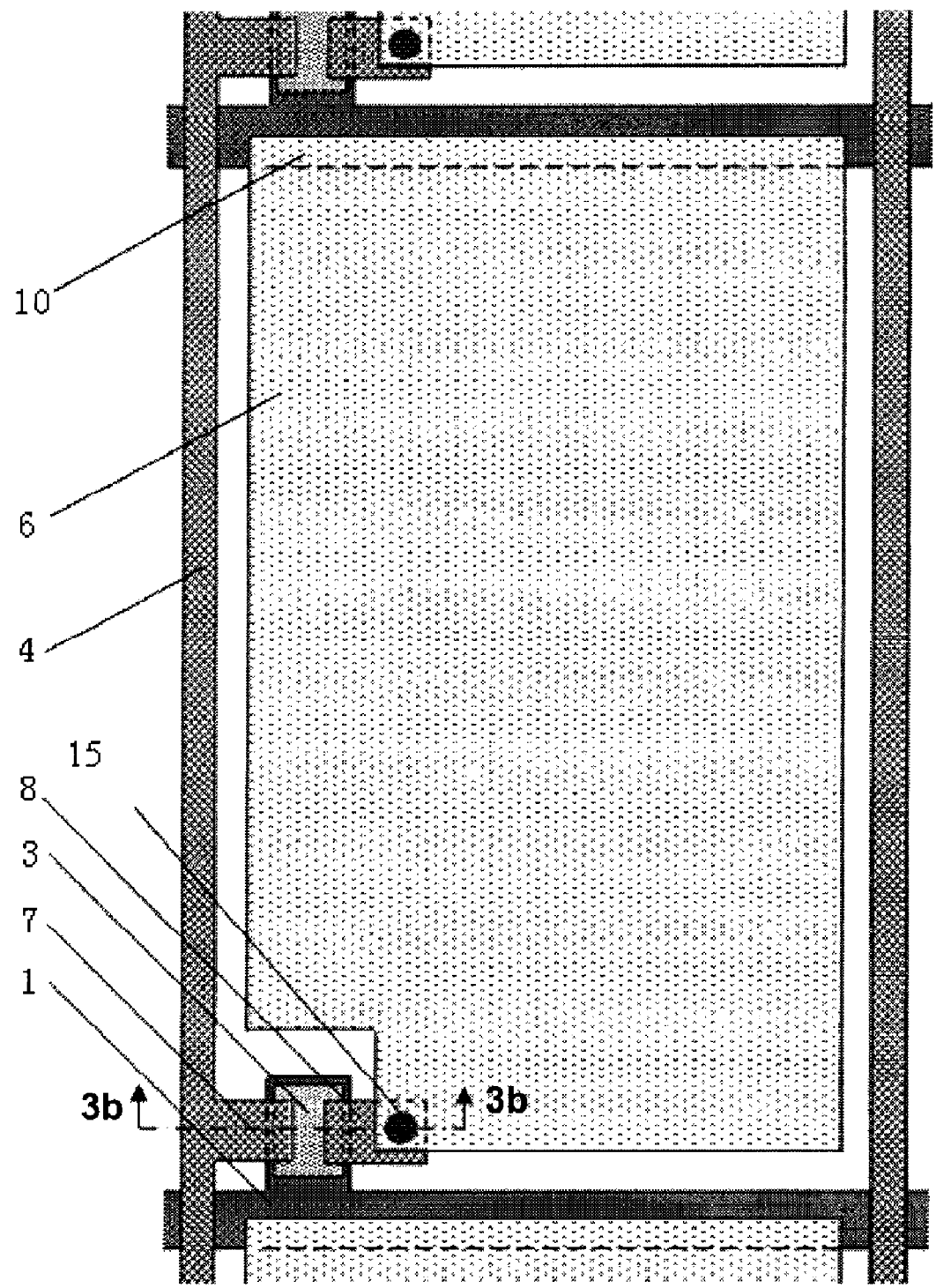
FIG. 2a shows a sub-pixel structure in which a storage capacitor Cst is formed by gate line according to the prior art.
Figure 2B:
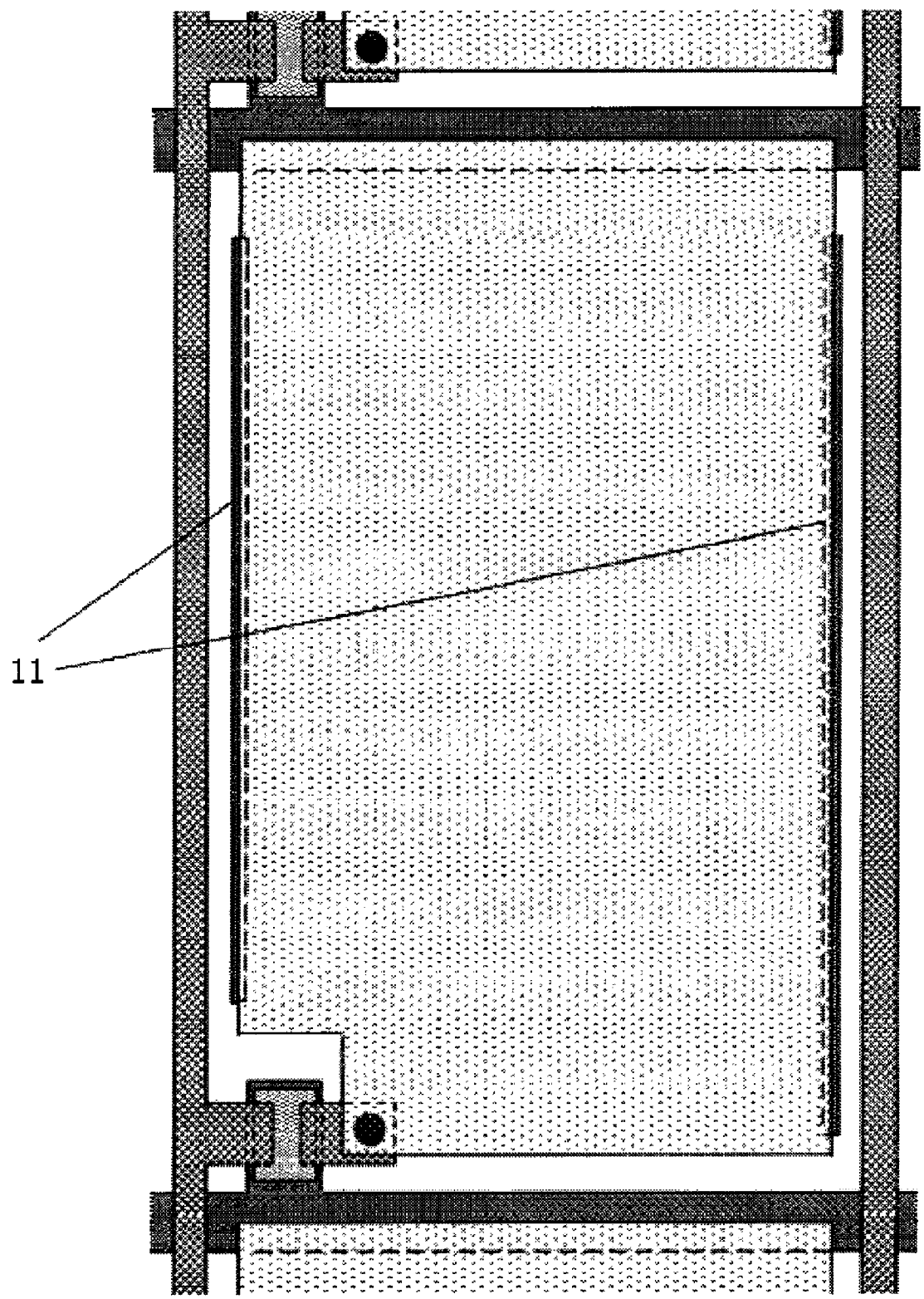
FIG. 2b shows a sub-pixel structure comprising light blocking bars in which a storage capacitor Cst is formed by a gate line according to the prior art.
Figure 2C:
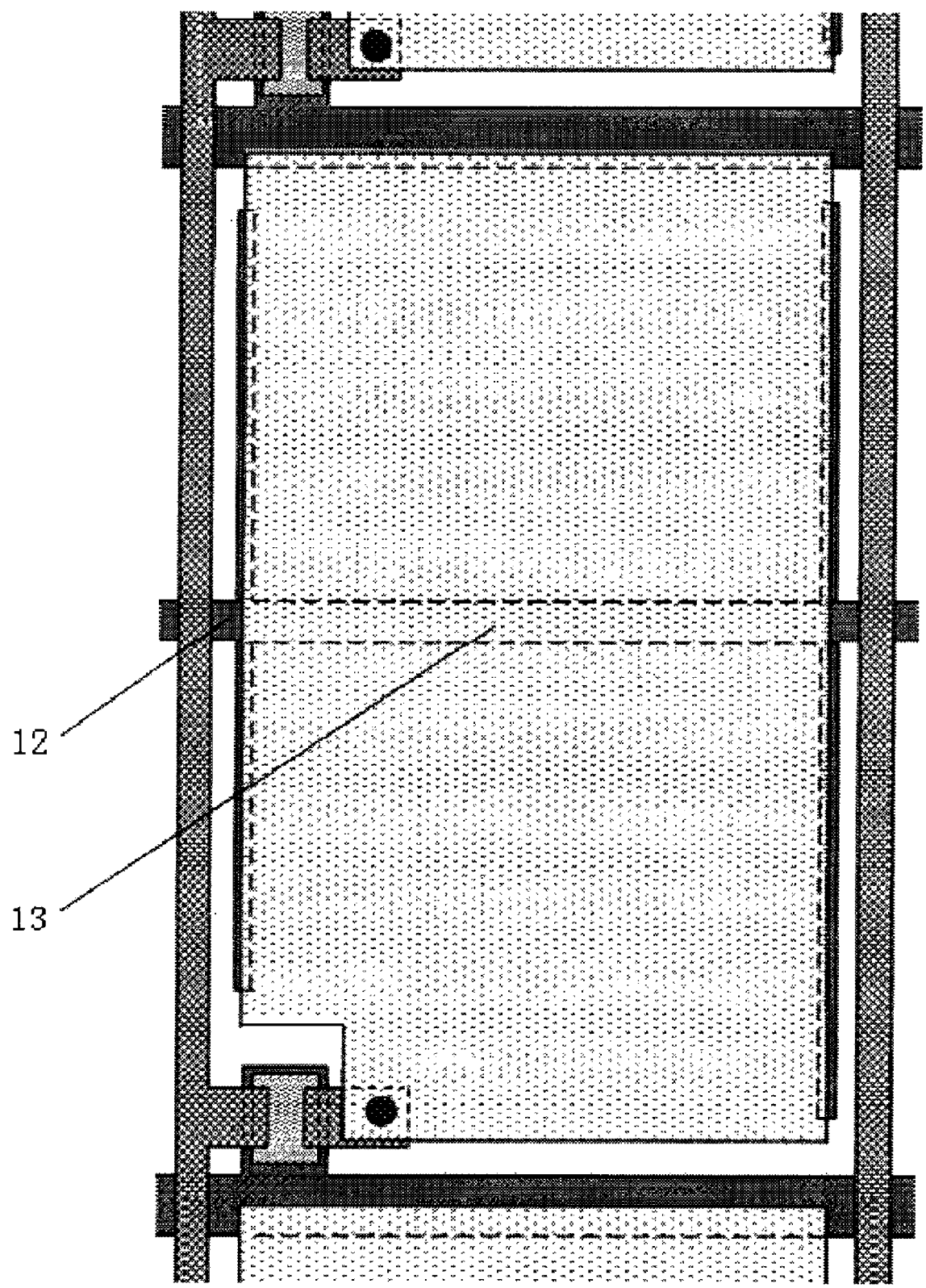
FIG. 2c shows a sub-pixel structure comprising light blocking bars in which a storage capacitor Cst is formed by a storage common electrode according to the prior art.
Figure 3A:
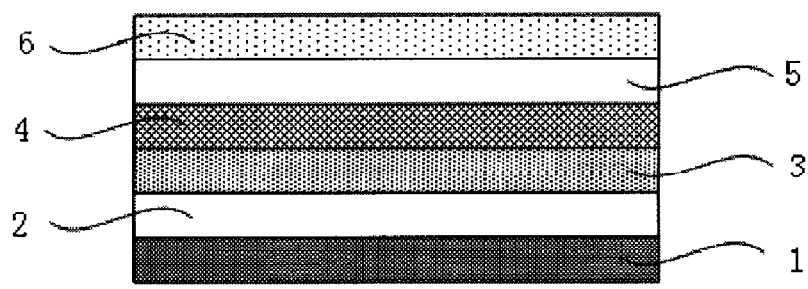
FIG. 3a is a cross-sectional view of a sub-pixel in any one of FIGS. 2a, 2b and 2c, through line 3b-3b of FIG. 2a, showing respective thin film layers.
Figure 3B:
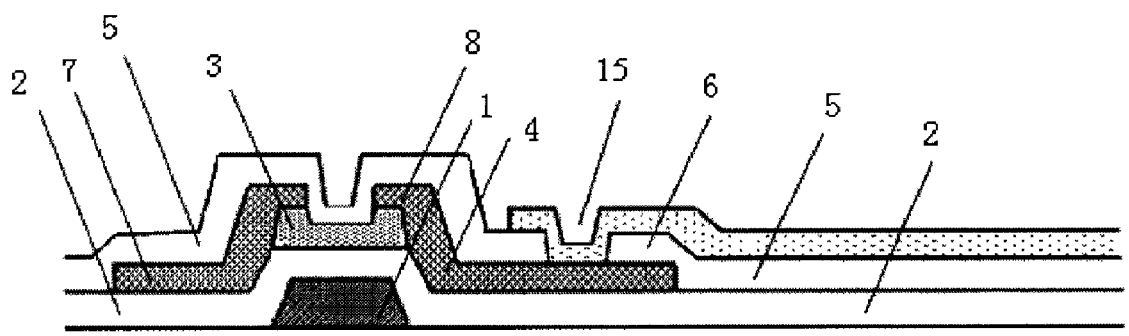

The TFT having the above channel structure according to the present invention may be applied to various sub-pixels of a TFT LCD, such as the sub-pixel structures as shown in FIGS. 2a-2c. Moreover, the above structure can be modified in various ways within the spirit of the invention. For example, the profile of the channel may comprise a curve of certain curvature instead of angles formed of straight lines as shown in the drawings.

In summary, regardless of the particular structure of the TFT LCD, the change of channel shape according to the present invention is formed during the process of source/drain electrode metal layer. Specifically, the bend profile of the source/drain electrode is formed over the gate metal layer, the gate insulating layer, and the active layer with the change in a mask plate for the source/drain electrode metal layer in combination with a photolithography process. The number of undulation in the bend profile of the channel region between the source and drain electrodes is N, where N≥1. The bend line may further comprise sub-bends and the number of the sub-bend is M, where M≥1.

Hereinafter a manufacturing method of the above channel structure and a TFT pixel structure having the same are described in detail according the embodiment of the present invention.

First, the gate metal layer of a thickness ranging from 1000 Å to 7000 Å is formed for example on a glass substrate by a magnetron sputtering method. The material of gate metal layer typically is a metal selected from the group consisting of Mo, Al, AlNi alloy, MoW alloy, Cr and Cu. The combinations of the above materials may also be used. Further, the gate metal layer can be formed in a single layer structure and in a multiple layer structure. A gate line and a gate electrode are formed from the gate metal layer on predetermined area over the glass substrate by exposure and etching process with a gate mask. In the case of forming light blocking bars and/or a storage common electrode, the gate metal layer is patterned to form light blocking bars and/or a storage common electrode at the time the gate line and the gate electrode are formed.

Next, the gate insulation layer 102 of a thickness between 1000 Å and 6000 Å and an active layer 103 of a thickness between 1000 Å and 6000 Å are sequentially formed over the substrate by a chemical vapor deposition (CVD) method for example. The material for the gate insulation layer 103 is typically selected from the group consisting of silicon nitride, silicon oxide, and silicon oxynitride. The active layer 103 may be an amorphous silicon (a-Si) and the like. The amorphous silicon (a-Si) of the active layer 103 is etched to form a silicon island after an exposure and etching with a mask for the active layer. The insulation layer between the gate metal layer and the a-Si layer functions as an etching stop layer. The a-Si layer may further be thermal annealed or laser annealed to form a polysilicon layer.

Next, by a process similar to that for the gate metal layer, the source/drain electrode metal layer 104 of a thickness between 1000 Å and 7000 Å is deposited over the substrate. The drain electrode 107 and source electrode 108 are formed at predetermined areas with a mask for the source/drain electrode metal layer. The drain electrode 107 and source electrode 108 are formed on the drain region and source region, respectively, in contact with the opposite ends of the active layer. The channel region is exposed between the drain electrode 107 and source electrode 108. In this step, the mask for the source/drain electrode metal layer is modified at the position corresponding to the channel region to have profile in a bend line. The number of undulations in the bend line is N, where N≥1. The bend line further includes sub-bends, and the number of the sub-bends is M, where M≥1.

Next, by a process similar to that for the gate insulation layer, a passivation layer 105 is deposited over the substrate in a thickness between 1000 Å and 6000 Å. The passivation layer 105 can be formed of silicon nitride. Similar to FIG. 2c, the gate metal layer 101 (and the light blocking bars and storage common electrode in the gate metal layer if formed) is uniformly covered by the gate insulation layer 102 and the passivation layer 105. The drain electrode 107 and the source electrode 108 are uniformly covered, such as to a uniform thickness, by the passivation layer 105. A via hole (not shown) in the passivation layer 105 over the source electrode are formed by exposure and etching process with a mask for the passivation layer 105. The via hole is used for connecting with the pixel electrode to be formed with the TFT.

Next, a transparent pixel electrode layer having a thickness less than 1000 Å is form over the passsivation layer 105, using a process similar to that for the gate metal layer or the source/drain electrode metal layer. A typical material for the transparent electrode may be indium tin oxide (ITO), indium tin oxide (IZO), or aluminum zinc oxide (AlZnO). Then a transparent pixel electrode 106 for each of the sub-pixel is formed by the similar photolithography process for the above layers with a mask for the transparent pixel electrode. A metal reflection electrode (e.g., aluminum) may be formed in case that a reflective TFT LCD is manufactured.

The above exemplary embodiment is only one implementation of the present invention, while other implementation is also possible by selecting different materials or material combinations, and/or different photolithography process such as a 3-mask or a 4-mask process. In the TFT structure of the present invention, the profile of the source/drain electrode is changed in a bend line. The number of undulations in the bend line is N, where N≥1. The bend line further includes sub-bends and the number of sub-bends is M, where M≥1. The direction change of each sub-bend is in a range from 0 degree to 180 degree. However, various modifications and variations may also be possible, and for example, the sub-bends are not the same but in different shape from each other The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor (TFT), comprising:
   a gate electrode formed over a substrate;
   a gate insulation layer formed over the gate electrode;
   an active layer having a source region, a drain region, and a channel region and formed on the gate insulation layer; and
   a source electrode and a drain electrode formed over the source region and drain region of the active layer respectively and opposing each other with respect to the channel region,
   wherein the profile of the channel region between the source electrode and the drain electrode is changed in a bend line having a plurality of undulation, each undulation of the bend line having at least one of an ascending edge and a descending edge, and each undulation of the bend line further comprises a plurality of steps in the ascending edge and a plurality of steps in the descending edge.

2. The TFT of claim 1, wherein the number of undulation in the bend line is N, where N≧1.

3. The TFT of claim 1, wherein the gate electrode and the data line are formed of a material selected from the group consisting of Mo, Al, AlNi alloy, MoW alloy, Cr, Cu, and any combination thereof in a structure selected from the group consisting of a single layer structure and a multiple layer structure.

4. The TFT of claim 1, wherein the gate insulation layer is formed of a material selected from the group consisting of silicon nitride, silicon oxide, and silicon oxynitride.

5. The TFT of claim 1, wherein the active layer is amorphous silicon (a-Si).

6. A method for forming a thin film transistor (TFT), comprising:
   forming a gale electrode over a substrate;
   forming a gate insulation layer over the gate electrode;
   forming an active layer having a source region, a drain region and a channel region on the gate insulation layer; and
   forming a source electrode and a drain electrode over the source region and drain region of the active layer, respectively, the source electrode and the drain electrode opposing with respect to the channel region;
   wherein the profile of the channel region between the source electrode and drain electrodes is changed in a bend line having a plurality of undulation, each undulation of the bend line having at least one of an ascending edge and a descending edge, and each undulation of the bend line further comprises a plurality of steps in the ascending edge and a plurality of steps in the descending edge.

7. The method of claim 6, wherein the source electrode and the drain electrode are patterned by an exposure and etching process with a mask, and the profile of the mask corresponding to the channel region is changed in the bend line.

8. The method of claim 6, wherein the number of undulations in the bend line is N, where N≧1.

9. The method of claim 6, wherein the gate electrode and the data line are formed of a material selected from the group consisting of Mo, Al, AlNi alloy, MoW alloy, Cr, Cu, and any combination thereof in a structure selected from the group consisting of a single layer structure and a multiple layer structure.

10. The method of claim 6, wherein the gate insulation layer is formed of a material selected from the group consisting of silicon nitride, silicon oxide, and silicon oxynitride.

11. The method of claim 6, wherein the active layer is amorphous silicon (a-Si).

12. The method of claim 6, further comprising after forming the source and drain electrode, forming a passivation layer on the substrate and patterning the passivation layer to form a via hole over one of the source and drain electrodes.

13. A TFT LCD, comprising:

a substrate;

a gate line and a data line formed on the substrate and crossing each other to define a sub-pixel region;

a pixel electrode formed in the sub-pixel region; and a TFT according to claim 1, formed at where the gate line and the data line cross, wherein the gate electrode of the TFT is connected with the gate line, one of the source and drain electrodes is connected with the data line, and the other one of the source and drain electrodes is connected with the pixel electrode.

* * * * *